(12) United States Patent
Yanagisawa

(10) Patent No.: US 8,034,511 B2
(45) Date of Patent: Oct. 11, 2011

(54) INSULATING MOUNT STRUCTURE, INSULATION MONITORING SYSTEM, AND INSULATION MONITORING METHOD FOR FUEL CELLS

(75) Inventor: Masanari Yanagisawa, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 1277 days.

(21) Appl. No.: 10/544,029

(22) PCT Filed: May 18, 2004

(86) PCT No.: PCT/JP2004/007063
§ 371 (c)(1),
(2), (4) Date: Jul. 29, 2005

(87) PCT Pub. No.: WO2004/105172
PCT Pub. Date: Dec. 2, 2004

(65) Prior Publication Data
US 2006/0115701 A1    Jun. 1, 2006

(30) Foreign Application Priority Data

May 22, 2003 (JP) ................. 2003-144612
Dec. 24, 2003 (JP) ................. 2003-426195

(51) Int. Cl.
*H01M 8/00*    (2006.01)
*H01M 2/02*    (2006.01)
*H01M 10/48*   (2006.01)

(52) U.S. Cl. .......... 429/516; 429/427; 429/428; 429/90; 429/508; 429/481; 429/529

(58) Field of Classification Search .................. None
See application file for complete search history.

(56) References Cited

U.S. PATENT DOCUMENTS 5,607,786 A    3/1997  Guthrie et al.
2002/0187380 A1*  12/2002  Tanaka et al. ................. 429/34

FOREIGN PATENT DOCUMENTS

| JP | 2-21573 A | 1/1990 |
|----|-----------|--------|
| JP | 6-251796 A | 9/1994 |
| JP | 2002-164070 A | 6/2002 |
| JP | 2002-190313 | * 7/2002 |
| JP | 2002-190313 A | 7/2002 |
| JP | 2002-367651 A | 12/2002 |

* cited by examiner

*Primary Examiner* — Barbara L. Gilliam
*Assistant Examiner* — Angela J. Martin
(74) *Attorney, Agent, or Firm* — Foley & Lardner LLP

(57) ABSTRACT

An insulating mount structure for a fuel cell, which includes insulating mounts (2) for mounting the fuel cell stack (1) on a grounded structure (7), and a water barrier (3) extending in a space between the fuel cell a stack (1) and the grounded structure (7), being electrically isolated from both of the fuel cell (1) and the grounded structure (7). The water barrier (3) is formed in a container shape having an opening (3a) on upper side thereof.

23 Claims, 5 Drawing Sheets

INSULATING MOUNT STRUCTURE, INSULATION MONITORING SYSTEM, AND INSULATION MONITORING METHOD FOR FUEL CELLS

TECHNICAL FIELD

The present invention relates to an insulating mount structure for fuel cells, a system for monitoring insulation status thereof, and a method for monitoring the same.

BACKGROUND ART

Fuel cells or a fuel cell stack are required, in practical use, to be isolated electrically from a surrounding structure thereof.

Japanese Patent Application Laid-Open Publication No. 2002-367651 discloses an insulating mount for electrically isolating a fuel cell stack inside a housing thereof. The insulating mount has an insulator provided between mounting bolts and the bottom wall of the housing.

DISCLOSURE OF INVENTION

However, in the above-mentioned insulating mount, in case cooling water leaks from the fuel cell stack and builds up in the housing, the mounting bolts and the insulators are submerged in the water, resulting in a failure in maintaining insulation between the fuel cell stack and the housing thereof.

The present invention was made in the light of the problem. An object of the present invention is to provide: an insulating mount structure for fuel cells, which prevents mounting bolts thereof from being submerged in cooling water and the like leaked from the fuel cells, and maintains the fuel cells insulated; a system for monitoring insulation status thereof; and a method for monitoring the same.

An aspect of the present invention is an insulating mount structure for a fuel cell, comprising: an insulating mount for mounting the fuel cell on a grounded structure; and a barrier extending in a space between the fuel cell and the grounded structure, and being electrically isolated from the fuel cell and the grounded structure, the barrier having a container shape with an opening on upper side thereof.

BRIEF DESCRIPTION OF THE DRAWINGS

The invention will now be described with reference to the accompanying drawings wherein.

BEST MODES FOR CARRYING OUT THE INVENTION

Figure 1A:
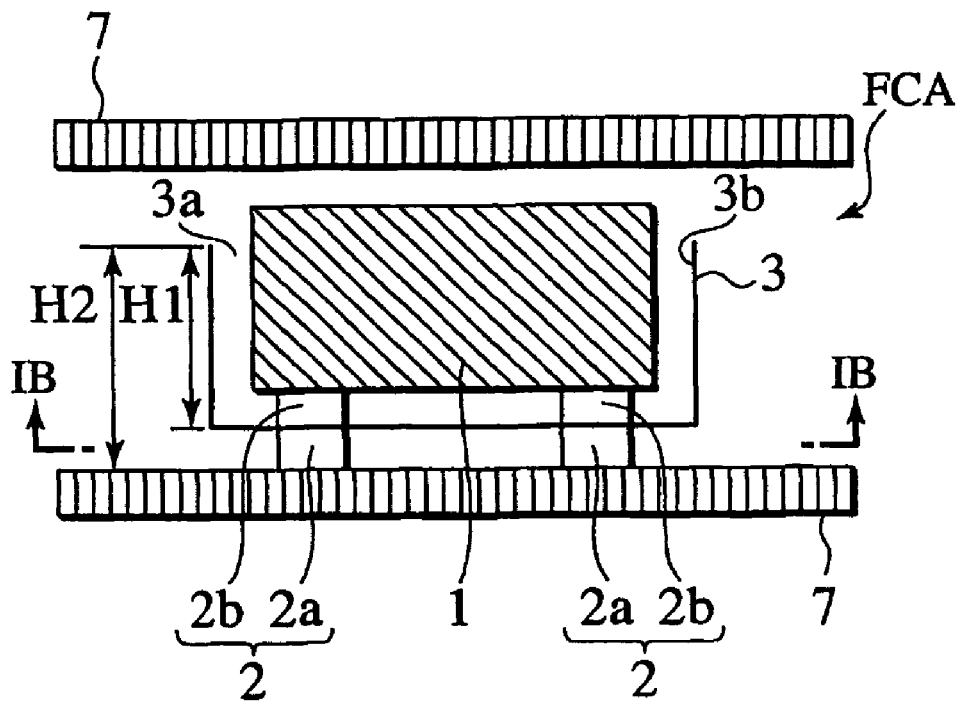
FIGS. 1A and 1B show an insulating mount structure for fuel cells according to a first embodiment of the present invention, FIG. 1A being a sectional view taken along a line IA-IA in FIG. 1B, and FIG. 1B being a sectional view taken along a line IB-IB in FIG. 1A.

Embodiments of the present invention will be explained below with reference to the drawings, wherein like members are designated by like reference characters.

First Embodiment

Figure 1B:
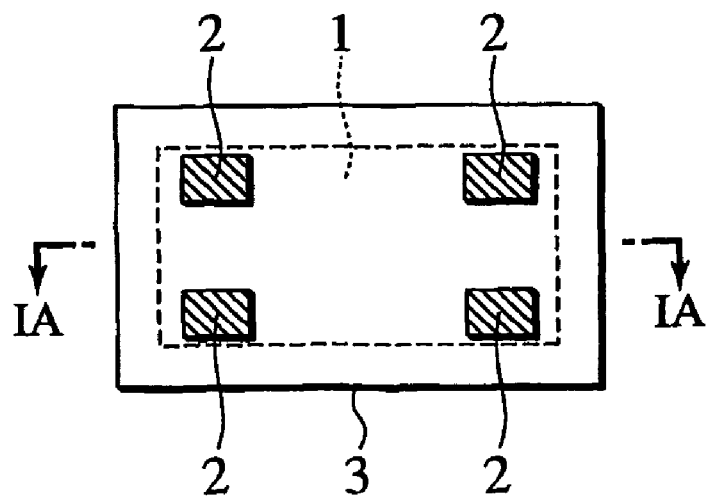

An insulating mount structure according to a first embodiment of the present invention is, as shown in FIGS. 1A and 1B, constituted of a fuel cell stack 1, insulating mounts 2, and a water barrier 3.

The fuel cell stack 1 is fixed to an electrically grounded structure 7, being supported, at four corners of the bottom face thereof, on the insulating mounts 2 which are mounting brackets on which insulating processing or treatment has been performed.

The water barrier 3 is formed to extend in a space between the fuel cell stack 1 and the grounded structure 7, and to have a container-like shape with an opening 3a at the top thereof. The fuel cell stack 1 is placed therein and surrounded by sidewalls 3b of the water barrier 3.

Specifically, the fuel cell stack 1 is fixed to the water barrier 3, being supported by upper mounts 2b of the insulating mounts 2, which are provided at four corners of the bottom face of the fuel cell stack 1 between the bottom face thereof and the upper face of the bottom of the water barrier 3. The water barrier 3 is fixed to the structure 7, being supported by lower mounts 2a of the insulating mounts 2, which are provided between the bottom face of the water barrier 3 and the structure 7 at four locations corresponding to the upper mounts 2a. Thus, the fuel cell stack 1, water barrier 3 and structure 7 are separated from and not in contact with each other, whereby these components are electrically insulated from each other. Hereinafter, an assembly of the combined fuel cell stack 1, mounts 2 and water barrier 3 will be called as an insulated fuel cell assembly FCA.

According to the first embodiment, even when water, such as reaction water generated by electrochemical reaction in the fuel cell stack 1 or cooling water thereof, leaks from the fuel cell stack 1, the water is collected and held in the space between the water barrier 3 and the fuel cell stack 1, being prevented from flowing out of the water barrier 3 to the structure 7. Therefore, the lower mounts 2a between the structure 7 and the water barrier 3 will not be submerged in water and maintained dry, and the insulation between the grounded structure 7 and the electrically neutral water barrier 3 is secured, unless the water collected inside the water barrier 3 builds up and the level of the collected water reaches a height H1 of the sidewall 3b thereof.

Meanwhile, even when water enters inside the structure 7 due to water invasion from outside or the like, the water is accumulated in the space between the water barrier 3 and the structure 7, being prevented from flowing into inside the water barrier 3. Therefore, the upper mounts 2b between the water barrier 3 and the fuel cell stack 1 will not be submerged in water and maintained dry, and the insulation between the fuel cell stack 1 and the water barrier 3 is secured, unless the water accumulated outside the water barrier 3 builds up and the level of the accumulated water reaches the top edge at a height H2 of the opening 3a of the water barrier 3.

Second Embodiment

Figure 2A:
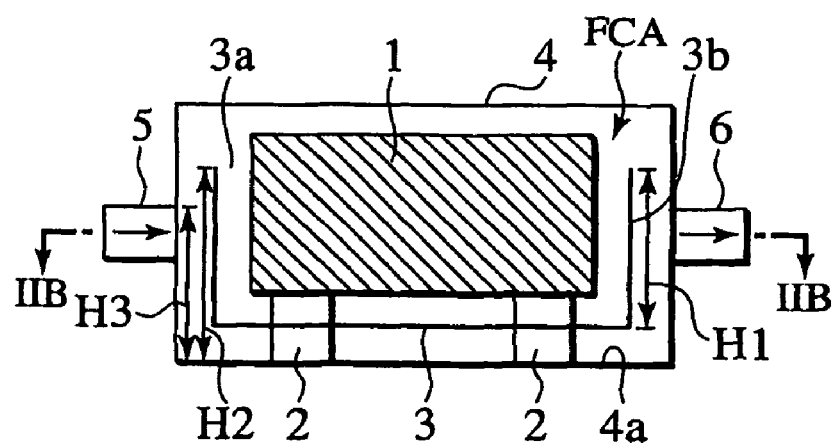
FIGS. 2A and 2B show an insulating mount structure for fuel cells according to a second embodiment of the present invention, FIG. 2A being a sectional view taken along a line IIA-IIA in FIG. 2B, and FIG. 2B being a sectional view taken along a line IIB-IIB in FIG. 2A.
Figure 2B:
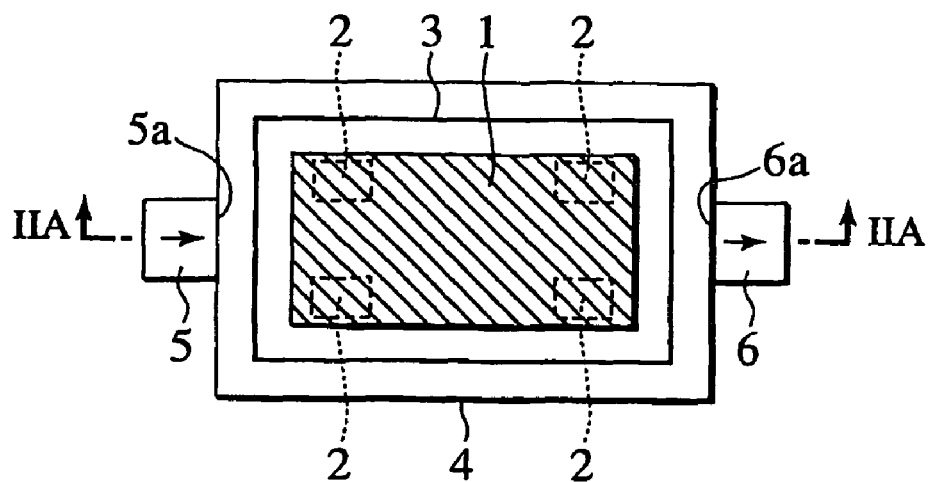

An insulating mount structure according to a second embodiment of the present invention is, as shown in FIGS. 2A and 2B, constituted of an insulated fuel cell assembly FCA (a fuel cell stack 1, mounts 2, and a water barrier 3) and an electrically grounded fuel cell housing 4 which houses the insulated fuel cell assembly FCA therein.

The housing 4 constitutes a ventilated housing for FCA with an air intake pipe 5 and an air discharge pipe 6 connected at opposing positions on the opposing sidewalls thereof. To be more specific, a vent 5a (first opening) of the air intake pipe 5 and a vent 6a (second opening) of the air discharge pipe 6 are provided at positions opposite to each other on the inner faces of the sidewalls of the fuel cell housing 4. Arrows in FIGS. 2A and 2B indicate the flowing directions of air intake and discharge.

As in the case of the first embodiment, the fuel cell stack 1 is fixed inside the fuel cell housing 4 to a bottom wall 4a thereof, being supported on the insulating mounts 2. The water barrier 3 is supported by the mounts 2 in an electrically neutral state, and encloses the fuel cell stack 1 inside. In other words, the fuel cell stack 1, water barrier 3 and fuel cell housing 4 are separated from and not in contact with each other, whereby these components are electrically insulated from each other. A height H2 from the bottom wall 4a of the fuel cell housing 4 to the top edge of an opening 3a of the water barrier 3 is larger than a height H3 of the top edges of the vents 5a and 6a on the sidewalls of the fuel cell housing 4.

According to the second embodiment, the top edge of the opening 3a of the water barrier 3 is higher than the top edges of the vents 5a and 6a, and sidewalls 3b of the water barrier 3 are extended to cover the vents 5a and 6a. Therefore, even when water and the like enters from outside through the air intake pipe 5 and the air discharge pipe 6 into the fuel cell housing 4, the inflowing matters or objects are blocked by the sidewalls 3b without wetting the fuel cell stack 1, whereby corrosions of or failures in the fuel cell stack 1 can be prevented. Only one of the vents 5a and 6a, for example, the vent 5a of the air intake pipe 5, through which the inflowing matters or objects enter more likely than the other vent 6a, may be positioned lower than the top edge at height H2 of the sidewall 3b of the water barrier 3.

Third Embodiment

Figure 3:
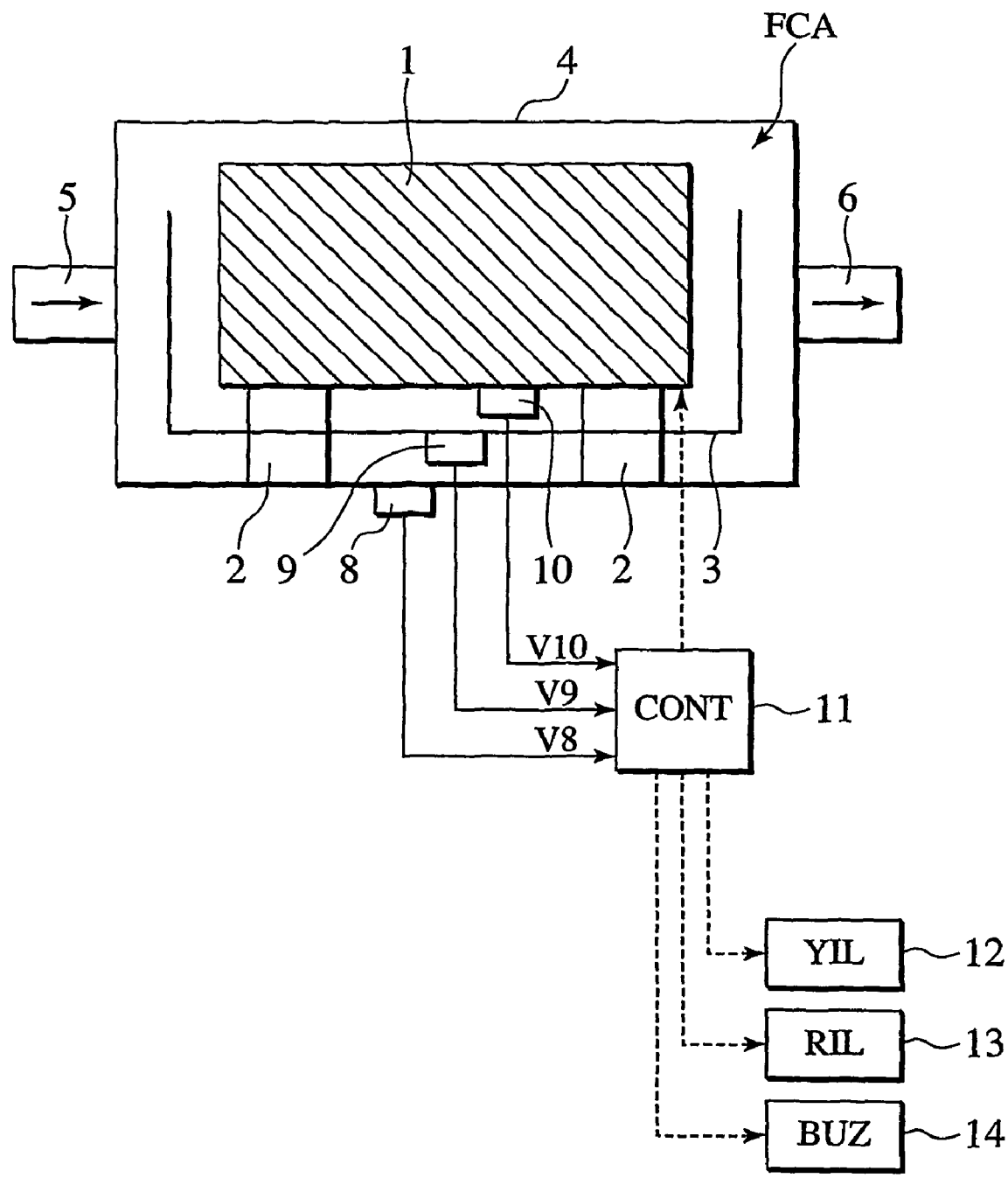
FIG. 3 shows a configuration of an insulation monitoring system according to a third embodiment of the present invention.

As shown in FIG. 3, a system for monitoring an insulation status according to a third embodiment of the present invention includes: an insulated fuel cell assembly FCA; a fuel cell housing 4; a sensor 8 which measures the electrical potential of the fuel cell housing 4; a sensor 9 which measures the electrical potential of a water barrier 3; a sensor 10 which measures the electrical potential of the fuel cell stack 1; and a controller 11 for processing data from the respective sensors 8, 9 and 10.

Figure 4:
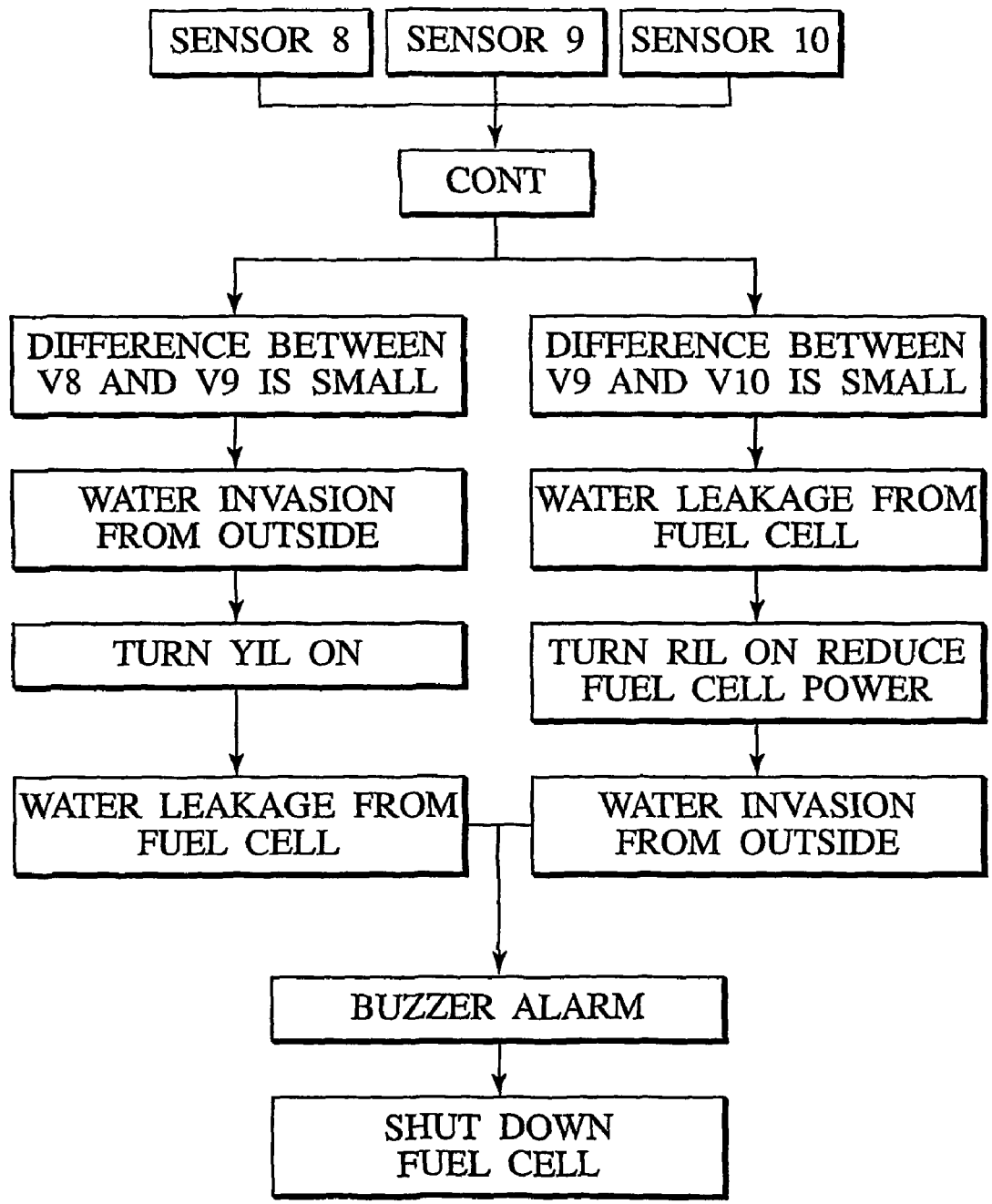
FIG. 4 is a flowchart showing a general control flow of the system in FIG. 3.

A description will be given of a system control flow and of control processing in the controller 11 with reference to FIGS. 4 and 5.

First, data of electrical potentials measured by the respective sensors 8, 9 and 10 are read into the controller 11, and comparisons are made in the controller 11 between a measured value V8 from the sensor 8 and a measured value V9 from the sensor 9 and between the measured value V9 from the sensor 9 and a measured value V10 from the sensor 10, respectively. When an absolute value |V9−V8|, the potential difference between the measured values V8 and V9, is equal to or below a first preset value PV1, which means the measured values V8 and V9 are substantially the same, it is determined that the fuel cell housing 4 and the water barrier 3 are electrically continuous through water accumulated in the space therebetween, and water or the like has invaded the fuel cell housing 4 from outside. Meanwhile, when an absolute value |V10−V9|, the potential difference between the measured values V9 and V10, is equal to or below a second preset value PV2, it is determined that the water barrier 3 and the fuel cell stack 1 are electrically continuous through water collected in the space therebetween, and water leakage from the fuel cell stack 1 has occurred. Next, when it is determined that water has invaded from outside, the user is alerted by a yellow indicating lamp 12. When it is determined that water leakage from the fuel cell stack 1 has occurred, the user is alerted by a red indicating lamp 13 which gives advice to shut down the operation of the fuel cell stack 1, and the power of the fuel cell stack 1 is then gradually reduced. Moreover, when water leakage from the fuel cell stack 1 is detected while the yellow indicating lamp 12 is on, or, when water invasion from outside is detected while the red indicating lamp 13 is on, the fuel cell stack 1 is shut down after or at the same time as the user is alerted by a buzzer 14. The respective preset values PV1 and PV2 can be arbitrarily set, and are preferably such values as to substantially meet the measured values V8, V9 and V10 from the respective sensors 8, 9 and 10. Moreover, the first and second preset values PV1 and PV2 may be set at the same value.

Figure 5:
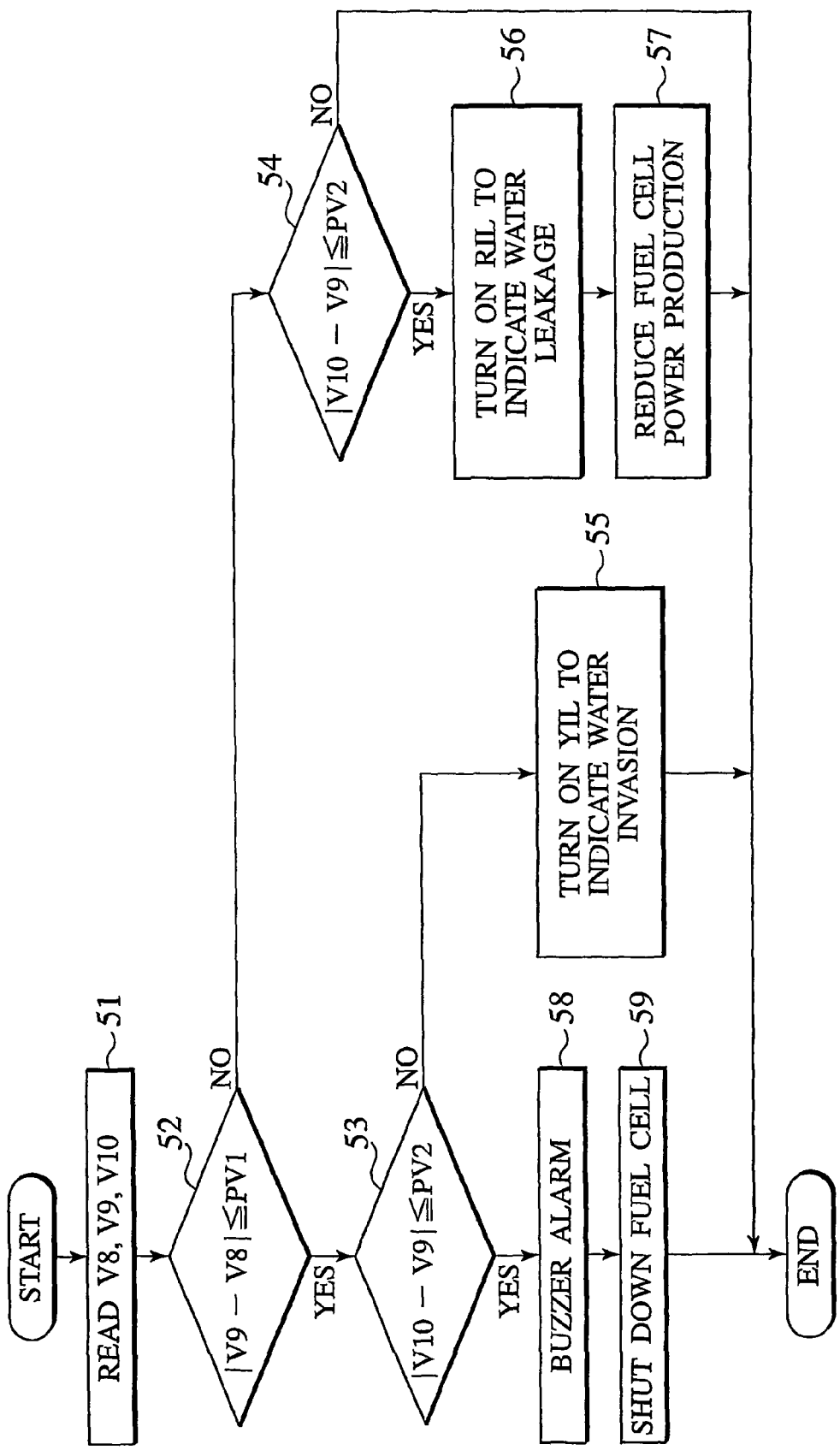
FIG. 5 is a flowchart showing control processing in a controller of the system in FIG. 3.

More specifically, the above control flow is realized by repeating the control processing shown in FIG. 5 at regular intervals in the controller 11.

The measured values V8, V9 and V10 from the respective sensors 8, 9 and 10 are read into the controller 11 in Step 51, and it is determined whether the absolute value |V9−V8|, the difference between the measured values V8 and V9, is equal to or below the first preset value PV1 (Step 52). Then, it is determined whether the absolute value |V10−V9|, the difference between the measured values V9 and V10, is equal to or below the second preset value PV2 (Step 53 or 54). If |V9−V8| is determined to be equal to or below the PV1 (Step 52) and |V10−V9| is determined not to be equal to or below the PV2 (Step 53), the yellow indicating lamp 12 is turned on (Step 55) to alert the user to water invasion from outside. If |V9−V8| is determined not to be equal to or below the PV1 (Step 52) and |V10−V9| is determined to be equal to or below the PV2 (Step 54), the red indicating lamp 13 is turned on (Step 56) to alert the user to occurrence of water leakage from the fuel cell stack 1, and thus the power of the fuel cell stack 1 is gradually reduced (Step 57). If |V9−V8| is determined to be equal to or below the PV1 (Step 52) and |V10−V9| is determined to be equal to or below the PV2 (Step 53), an alarm is given by means of the buzzer 14 (Step 58) and the fuel cell stack 1 is shut down (Step 59). If |V9−V8| is not equal to or below the PV1 (Step 52) and |V10−V9| is not equal to or below the PV2 (Step 54), operation of the fuel cell stack 1 is continued.

According to the third embodiment, by monitoring the potential of the fuel cell stack 1, water barrier 3 and fuel cell housing 4, water leakage from the fuel cell stack 1 can be detected when the potential difference V10−V9 between the fuel cell stack 1 and the water barrier 3 reaches or is approaching the preset value PV2. Moreover, when the potential difference V9−V8 between the water barrier 3 and the fuel cell housing 4 reaches or is approaching the preset value PV1, water invasion from outside can be detected. Furthermore, even when there is water inside the fuel cell housing 4, if it is judged that the water has invaded the fuel cell housing 4 from outside and is accumulated outside the water barrier 3, operation of the fuel cell stack 1 can be continued as long as the insulation thereof can be maintained.

The preferred embodiments described herein are illustrative and not restrictive, and the invention may be practiced or embodied in other ways without departing from the spirit or essential character thereof. The shape of the fuel cell housing 4, the positions of the vents 5*a* and 6*a* where the air intake pipe 5 and the air discharge pipe 6 are attached to the housing 4, the position(s) and the number of the mount(s) 2, the shape of the water barrier 3, etc. can be freely set without departing from the effects of the embodiments. The scope of the invention being indicated by the claims, and all variations which come within the meaning of claims are intended to be embraced herein.

The present disclosure relates to subject matters contained in Japanese Patent Application No. 2003-144612, filed on May 22, 2003, and Japanese Patent Application No. 2003-426195, filed on Dec. 24, 2003, the disclosure of which are expressly incorporated herein by reference in their entirety.

INDUSTRIAL APPLICABILITY

In an insulating mount structure of the present invention, a water barrier enclosing a fuel cell stack is provided in the space between the fuel cell stack and a grounded structure, being electrically isolated from both of the fuel cell stack and the structure. Accordingly, even when water generated in the fuel cell stack, cooling water thereof and the like leak from the fuel cell stack inside the water barrier, the water is collected and held inside the water barrier, and insulating mounts supporting the water barrier on the grounded structure is maintained dry. Therefore, the present invention can be utilized to maintain insulation between fuel cells and its surrounding structure.

The invention claimed is:

1. A fuel cell assembly comprising a fuel cell and an insulating mount structure for the fuel cell, comprising:
    an insulating mount for mounting the fuel cell on a grounded structure; and
    a barrier extending in a space between the fuel cell and the grounded structure, and being supported by the insulating mount and held in the space in a spaced position, the barrier being electrically isolated from the fuel cell and the grounded structure, the barrier having a container shape with an opening on an upper side thereof.

2. A fuel cell assembly comprising the insulating mount structure according to claim 1, wherein the barrier has a sidewall surrounding the fuel cell.

3. A fuel cell assembly comprising the insulating mount structure according to claim 2, wherein the grounded structure comprises a housing of the fuel cell.

4. A fuel cell assembly comprising the insulating mount structure according to claim 3, wherein the housing is provided with a first opening to bring outside air into the housing and a second opening to discharge air inside the housing to outside.

5. A fuel cell assembly comprising the insulating mount structure according to claim 4, wherein a top edge of the sidewall of the barrier is positioned higher than the first opening of the housing.

6. A fuel cell assembly comprising the insulating mount structure according to claim 1, wherein the insulating mount comprises an upper insulating mount and a lower insulating mount, and the barrier is sandwiched between and supported by the upper insulating mount and the lower insulating mount.

7. An insulation monitoring system for a fuel cell, comprising:
    an insulating mount for mounting the fuel cell on a grounded structure;
    a barrier extending in a space between the fuel cell and the grounded structure, and being supported by the insulating mount and held in the space in a spaced position, the barrier being electrically isolated from the fuel cell and the grounded structure, the barrier having a container shape with an opening on an upper side thereof;
    a first sensor configured to measure potential of the grounded structure;
    a second sensor configured to measure potential of the barrier;
    a third sensor configured to measure potential of the fuel cell; and
    a controller configured to judge that water has invaded from outside when a difference between the potential measured by the first sensor and the potential measured by the second sensor is within a first range, and that water is leaking from the fuel cell when a difference between the potential measured by the second sensor and the potential measured by the third sensor is within a second range.

8. An insulation monitoring method for a fuel cell, comprising:
    having an open-top container-shaped barrier supported and mounted in a first spaced position on a grounded structure by a first insulating mount;
    having a fuel cell supported and mounted in a second spaced position inside the barrier by a second insulating mount;
    measuring potential of the grounded structure;
    measuring potential of the barrier;
    measuring potential of the fuel cell;
    monitoring a difference between the potential measured for the grounded structure and the potential measured for the barrier; and
    monitoring a difference between the potential measured for the barrier and the potential measured for the fuel cell.

9. A fuel cell assembly comprising the insulating mount structure according to claim 1, wherein the barrier is solid material capable of having an electrical potential.

10. A fuel cell assembly comprising the insulating mount structure according to claim 1, wherein the barrier is held in the space at a first spaced distance from the fuel cell and a second spaced distance from the grounded structure.

11. A fuel cell assembly comprising the insulating mount structure according to claim 1, wherein the opening of the container shape of the barrier is formed by sidewalls positioned at a spaced distance from the fuel cell.

12. A fuel cell assembly comprising the insulating mount structure according to claim 1, wherein the barrier does not contact the fuel cell and does not contact the grounded structure.

13. The insulation monitoring system according to claim 7, wherein the barrier is solid material capable of having an electrical potential.

14. The insulation monitoring system according to claim 7, wherein the barrier is held in the space at a first spaced distance from the fuel cell and a second spaced distance from the grounded structure.

15. The insulation monitoring system according to claim 7, wherein the opening of the container shape of the barrier is formed by sidewalls positioned at a spaced distance from the fuel cell.

16. The insulation monitoring system according to claim 7, wherein the barrier does not contact the fuel cell and does not contact the grounded structure.

17. The insulation monitoring method according to claim 8, wherein the barrier is solid material capable of having an electrical potential.

18. The insulation monitoring method according to claim 8, wherein the barrier is mounted in the first spaced position at a first spaced distance from the grounded structure, and wherein the fuel cell is mounted in the second spaced position at a second spaced distance from the barrier.

19. The insulation monitoring method according to claim 8, wherein the open-top of the container-shaped barrier is formed by sidewalls positioned at a spaced distance from the fuel cell.

20. The insulation monitoring method according to claim 8, wherein the barrier does not contact the fuel cell and does not contact the grounded structure.

21. A fuel cell assembly comprising the insulating mount structure according to claim 1, wherein the barrier is held in the space at a spaced distance from the grounded structure by the insulating mount.

22. The insulation monitoring system according to claim 7, wherein the barrier is held in the space at a spaced distance from the grounded structure by the insulating mount.

23. The insulation monitoring method according to claim 8, wherein the barrier is held in the space at a spaced distance from the grounded structure by the first insulating mount.

* * * * *